(12) United States Patent
Kinoshita et al.

(10) Patent No.: US 9,632,185 B2
(45) Date of Patent: Apr. 25, 2017

(54) SCINTILLATOR PANEL AND METHOD FOR MANUFACTURING THE SAME

(71) Applicant: Toray Industries, Inc., Chuo-ku, Tokyo (JP)

(72) Inventors: Hideki Kinoshita, Otsu (JP); Tsubasa Hamano, Otsu (JP); Masaki Okamura, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 60 days.

(21) Appl. No.: 14/646,539

(22) PCT Filed: Nov. 20, 2013

(86) PCT No.: PCT/JP2013/081279
§ 371 (c)(1),
(2) Date: May 21, 2015

(87) PCT Pub. No.: WO2014/080941
PCT Pub. Date: May 30, 2014

(65) Prior Publication Data
US 2015/0309190 A1     Oct. 29, 2015

(30) Foreign Application Priority Data

Nov. 26, 2012   (JP) .................................. 2012-257214

(51) Int. Cl.
*G01T 1/20*     (2006.01)
*G21K 4/00*     (2006.01)
(Continued)

(52) U.S. Cl.
CPC ............ *G01T 1/2002* (2013.01); *G01T 1/202* (2013.01); *G01T 1/2018* (2013.01); *G03F 7/40* (2013.01); *G21K 4/00* (2013.01)

(58) Field of Classification Search
CPC .................................. G01T 1/20; G03F 7/40
See application file for complete search history.

(56) References Cited

U.S. PATENT DOCUMENTS 6,043,604 A       3/2000   Horiuchi
2002/0079455 A1*  6/2002   Wieczorek ............ G01T 1/2018
                                                        250/367

(Continued)

FOREIGN PATENT DOCUMENTS

CN   1981389 A     6/2007
EP   0126564       11/1984
(Continued)

OTHER PUBLICATIONS

Extended European Search Report dated Jun. 30, 2016 for European Application No. 13857327.4, 12 pages.
(Continued)

*Primary Examiner* — Marcus Taningco
(74) *Attorney, Agent, or Firm* — RatnerPrestia

(57) ABSTRACT

The present invention provides a scintillator panel which is provided with a narrow-width barrier rib with high accuracy in a large area, and also has high luminous efficiency and realizes clear image quality. The present invention provides a scintillator panel including a sheet-like substrate, a barrier rib provided on the substrate, and a scintillator layer filled in cells divided by the barrier rib, wherein the barrier rib is made of a material containing a low melting point glass as a main component, and the scintillator layer is made of a phosphor and a binder resin.

10 Claims, 1 Drawing Sheet

(51) Int. Cl.
G03F 7/40 (2006.01)
G01T 1/202 (2006.01)

(56) References Cited

U.S. PATENT DOCUMENTS

| | | | | |
|---|---|---|---|---|
| 2002/0181647 | A1* | 12/2002 | Venkataramani | G01T 1/202 378/19 |
| 2004/0232342 | A1* | 11/2004 | Aykac | G01T 1/202 250/367 |
| 2004/0251420 | A1* | 12/2004 | Sun | G01T 1/2018 250/370.09 |
| 2005/0104000 | A1* | 5/2005 | Kindem | G01T 1/1644 250/361 R |
| 2005/0184242 | A1* | 8/2005 | Hoffman | A61B 6/032 250/368 |
| 2006/0226370 | A1 | 10/2006 | Gia | |
| 2008/0042150 | A1 | 2/2008 | Yamaguchi | |
| 2010/0034345 | A1* | 2/2010 | Heismann | G01T 1/20 378/19 |
| 2011/0215223 | A1 | 9/2011 | Unagami | |
| 2014/0091235 | A1 | 4/2014 | Iguchi | |
| 2015/0241569 | A1 | 8/2015 | Okamura | |
| 2015/0316659 | A1 | 11/2015 | Okamura | |

FOREIGN PATENT DOCUMENTS

| | | |
|---|---|---|
| EP | 2922067 | 9/2015 |
| JP | 60166900 | 8/1985 |
| JP | 05060871 | 3/1993 |
| JP | 05188148 | 7/1993 |
| JP | 2001330677 | 11/2001 |
| JP | 2002202373 | 7/2002 |
| JP | 3333278 | 10/2002 |
| JP | 2004163169 | 6/2004 |
| JP | 2004325178 | 11/2004 |
| JP | 2011007552 | 1/2011 |
| JP | 2011188148 | 9/2011 |
| JP | 2011225414 | 11/2011 |
| JP | 2012002627 | 1/2012 |
| WO | 2012161304 | 11/2012 |

OTHER PUBLICATIONS

International Search Report for International Application No. PCT/JP2013/081279 mailed Jan. 14, 2014.

* cited by examiner

SCINTILLATOR PANEL AND METHOD FOR MANUFACTURING THE SAME

CROSS REFERENCE TO RELATED APPLICATIONS

This is the U.S. National Phase application of PCT/JP2013/081279, filed Nov. 20, 2013, which claims priority to Japanese Patent Application No. 2012-257214, filed Nov. 26, 2012, the disclosures of each of these applications being incorporated herein by reference in their entireties for all purposes.

FIELD OF THE INVENTION

The present invention relates to a scintillator panel used in a radiation detection device which is used for a medical diagnostic apparatus, a nondestructive inspection instrument, and the like.

BACKGROUND OF THE INVENTION

Heretofore, X-ray images using films have widely been used in medical settings. However, the X-ray image using a film provides analog image information, and thus digital radiation detection devices such as computed radiography (CR) and flat panel radiation detection devices (flat panel detectors: FPDs) have recently been developed.

In a flat panel X-ray detector (FPD), a scintillator panel is used for converting radiation into visible light. The scintillator panel contains an X-ray phosphor such as cesium iodide (CsI) and the X-ray phosphor emits visible light in response to applied X-ray, and the emitted light is converted into an electric signal by a thin film transistor (TFT) or a charge-coupled device (CCD) to thereby convert X-ray information into digital image information. However, the FPD has a problem such as a low S/N ratio. In order to increase the S/N ratio, there have been proposed methods of irradiating with X-ray from a light detector side (Patent Literatures 1 and 2), and also there have been proposed methods of filling cells divided by a barrier rib with an X-ray phosphor, so as to reduce an influence of the scattering of visible light due to the X-ray phosphor (Patent Literatures 3 to 6).

The method which has hitherto been used as a method for forming the barrier rib is a method of etching a silicon wafer, or a method in which a glass paste as a mixture of a pigment or a ceramic powder and a low melting point glass powder is pattern-printed in multiple layers using a screen printing method, and then fired to form a barrier rib. However, in the method of etching a silicon wafer, the size of a formable scintillator panel is limited by the size of the silicon wafer, and a scintillator panel having a large size of 500 mm square could not be obtained. A plurality of small-size panels should be arranged for making a large-size panel. However, it is difficult to produce the scintillator panel in view of accuracy, and a large-area scintillator panel was scarcely produced.

In the multi-layer screen printing method using a glass paste, it is difficult to process with high accuracy due to a dimensional variation of a screen printing sheet, or the like. When multi-layer screen printing is performed, a definite barrier rib width is required for increasing the strength of a barrier rib in order to prevent destructive defects of the barrier rib. However, if the width of the barrier rib increases, a space between barrier ribs becomes relatively small, so that a volume available for filling an X-ray phosphor decreases, and the filling amount is not uniform. Therefore, a scintillator panel obtained in this method has a disadvantage such as a decrease in luminescence or occurrence of luminous unevenness because of too small amount of an X-ray phosphor. This disadvantage of flexibility is an obstacle to formation of clear images in photographing at a low dose.

PATENT LITERATURE

[Patent Literature 1]
  Japanese Patent No. 3333278
[Patent Literature 2]
  Japanese Patent Laid-Open Publication No. 2001-330677
[Patent Literature 3]
  Japanese Patent Laid-Open Publication No. 5-60871
[Patent Literature 4]
  Japanese Patent Laid-Open Publication No. 5-188148
[Patent Literature 5]
  Japanese Patent Laid-Open Publication No. 2011-188148
[Patent Literature 6]
  Japanese Patent Laid-Open Publication No. 2011-007552

SUMMARY OF THE INVENTION

Production of a scintillator panel having high luminous efficiency and is capable of realizing clear images requires technology for processing a barrier rib, capable of processing with high accuracy in a large area and reducing the width of the barrier rib, and technology which efficiently guides visible light emitted by a phosphor to a detector side without leaking outside the barrier rib.

An object of the present invention is to solve the problems mentioned above and to provide a scintillator panel which is provided with a narrow-width barrier rib with high accuracy in a large area, and also has high luminous efficiency and realizes clear image quality.

The above-mentioned object is achieved by any of the following technical means:

(1) A scintillator panel including a sheet-like substrate, a barrier rib provided on the substrate, and a scintillator layer filled in cells divided by the barrier rib, wherein
  the barrier rib is made of a material containing a low melting point glass as a main component, and
  the scintillator layer is made of a phosphor and a binder resin;

(2) The scintillator panel according to the above (1), wherein a refractive index of Np of the phosphor and a refractive index of Nb of the binder resin satisfy a relation:

$$-0.3 < Np - Nb < 0.8;$$

(3) The scintillator panel according to the above (1) or (2), wherein a filling rate of the scintillator layer is 50% by volume or more, and the content of the binder resin in the scintillator layer is 50% by mass or less;

(4) The scintillator panel according to any one of the above (1) to (3), wherein the phosphor has an average particle diameter Dp of 0.1 to 25 μm.

(5) The scintillator panel according to any one of the above (1) to (4), wherein the phosphor is a gadolinium oxysulfide powder;

(6) The scintillator panel according to any one of the above (1) to (5), wherein the binder resin has a light transmittance of 50% or more;

(7) The scintillator panel according to any one of the above (1) to (6), wherein the binder resin is a resin selected from the group consisting of an acrylic resin, an epoxy resin, a polyester resin, a butyral resin, a polyamide resin, a silicone resin, and ethyl cellulose;

(8) The scintillator panel according to any one of the above (1) to (7), wherein the barrier rib is made of a material which contains a low melting point glass containing 2 to 20% by mass of an alkali metal oxide as a main component;

(9) The scintillator panel according to any one of the above (1) to (8), wherein a refractive index Nr of the barrier rib, and the Nb satisfy a relation:

$-0.2 \leq Nr-Nb \leq 0.2$;

(10) The scintillator panel according to any one of the above (1) to (9), wherein a width L2 of the interface where the barrier rib and the substrate are in contact each other is larger than a width L1 of the top of the barrier rib;

(11) The scintillator panel according to any one of the above (1) to (10), wherein a reflecting layer is formed in a surface of the barrier rib; and

(12) A method for manufacturing a scintillator panel, the method including:

a step of forming a photosensitive paste coating film by applying a photosensitive paste containing a low melting point glass and a photosensitive organic component onto a substrate;

an exposure step of exposing the obtained photosensitive paste coating film to light;

a development step of dissolving and removing a part of the exposed photosensitive paste coating film which is soluble in a developer;

a firing step of heating the photosensitive paste coating film pattern after development to a firing temperature of 500° C. to 700° C. to thereby remove the organic component, and soften and sinter the low melting point glass, thus forming a barrier rib; and a step of filling cells divided by the barrier rib with a phosphor and a binder resin.

DETAILED DESCRIPTION OF EMBODIMENTS OF THE INVENTION

Preferred configurations of a scintillator panel and a radiation detection device using the same of the present invention will be described with reference to FIG. 1 and FIG. 2, but the present invention is not limited thereto.

Figure 1:
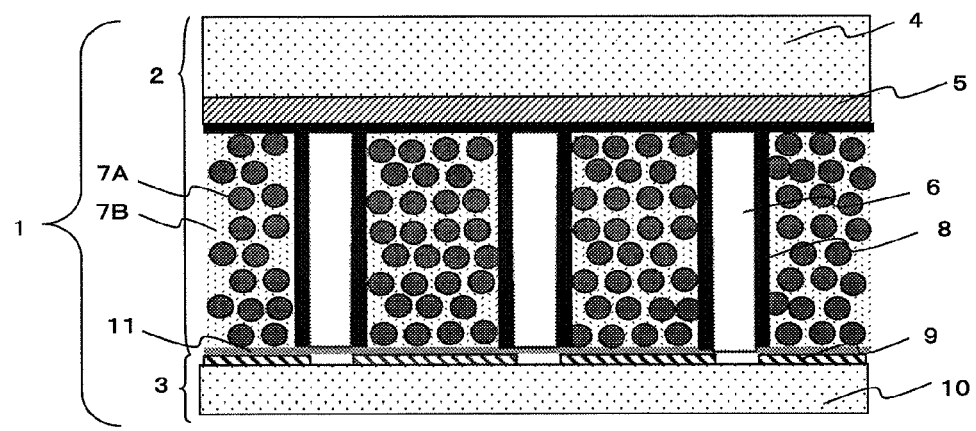
FIG. 1 is a sectional view schematically showing the configuration of a radiation detection device including a scintillator panel of an embodiment of the present invention.
Figure 2:
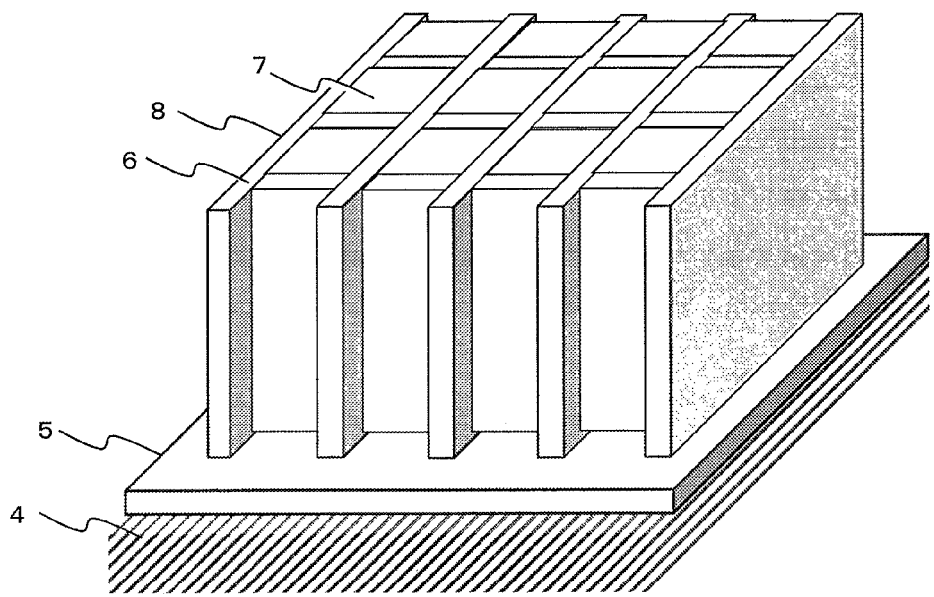
FIG. 2 is a perspective view schematically showing the configuration of the scintillator panel of an embodiment of the present invention.

FIG. 1 is a sectional view schematically showing the configuration of a radiation detection device including a scintillator panel of an embodiment of the present invention. FIG. 2 is a perspective view schematically showing an example of the configuration of the scintillator panel of an embodiment of the present invention. The radiation detection device 1 includes a scintillator panel 2 and a light detector 3. The scintillator panel 2 includes a scintillator layer 7 made of a phosphor 7A and a binder resin 7B, and absorbs energy of an incident radiation such as X-ray to emit electromagnetic wave having a wavelength ranging from 300 to 800 nm, i.e. electromagnetic wave (light) which ranges from ultraviolet light to infrared light with visible light at the center.

The scintillator panel 2 is composed of a sheet-like scintillator panel side substrate 4, a rib 6 formed thereon, and a scintillator layer 7 made of a phosphor and a binder resin filled in a space divided by the barrier rib. A space divided by the barrier rib 6 is sometimes called a cell. Radiation may be incident from either a scintillator panel side or a light detector side. A radiation shielding layer 5 is preferably formed between a substrate and a barrier rib on the side where radiation is not incident. For example, since the scintillator panel 2 shown in FIG. 1 is an aspect in which radiation is incident from the light detector 3, a radiation shielding layer 5 is formed between a substrate, namely, a scintillator panel side substrate 4 and a barrier rib 6 on the side where radiation is not incident. Radiation passed through the scintillator layer 7 is absorbed by the radiation shielding layer 5, thus enabling shielding of radiation so as not to leak outside the radiation detection device. The radiation shielding layer 5 preferably has a high reflectance of visible light. A reflecting layer 8 is preferably formed on the scintillator panel side substrate 4 or the radiation shielding layer 5. These reflecting layers 8 can efficiently guide light emitted by a phosphor 7A to the light detector 3 side.

The light detector 3 is composed of a light detector side substrate 10, and a photoelectric conversion layer 9 formed thereon. It is possible to use, as the substrate 10, insulating substrate such as a glass substrate, a ceramic substrate, or a resin substrate. The photoelectric conversion layer 9 is that obtained by forming a light detection pixel composed of a photomultiplier tube, a photosensor such as a photodiode or a PIN photodiode, and a thin film transistor (TFT) in a matrix-like shape. The radiation detection device 1 is formed by laminating a scintillator panel 2 with a photoelectric conversion layer 9 of a light detector 3 so as to face each other. An adhesive layer 11 made of a polyimide resin is preferably formed between a barrier rib 6 and a scintillator layer 7 of a scintillator panel 2, and the light detector 3. When light is incident from the light detector 3 side, radiation is passed through the photoelectric conversion layer 9, and then converted into visible light in the scintillator layer 7, and the visible light is detected by the photoelectric conversion layer 9, photo electrically converted, and then outputted.

In order to enhance sharpness of the radiation detection device 1, the barrier rib 6 of a scintillator panel 2 is preferably located at the part between adjacent pixels in the photoelectric conversion layer 9. Each cell of the scintillator panel 2 is divided by the barrier rib. When the size and pitch of pixels formed in a matrix-like shape are made coincident with the size and pitch of cells of the scintillator panel 2, each pixel of a photoelectric conversion element is made correspondent with each cell of the scintillator panel. If light emitted in a scintillator layer 7 is scattered by the phosphor, scattered light is reflected by the barrier rib. Therefore, scattered light can be prevented from reaching the adjacent cell. As a result, blurring of images due to light scattering can be reduced, thus enabling high-accuracy photographing.

A reflecting layer 8 is preferably formed on a surface of a barrier rib 6. Formation of the reflecting layer 8 makes it possible to efficiently guide light emitted from the phosphor in cells to a light detector 3. It is also preferred to form a reflecting layer 8 on one side of the barrier rib 6. Light emitted from the phosphor in cells reflects by the reflecting layer 8 and is not transmitted through adjacent cells, thus enabling high-accuracy photographing. Meanwhile, since the barrier including no reflecting layer formed thereon transmits light, light reached the barrier rib on the side where a reflecting layer of the barrier rib is not formed is transmitted through the barrier rib. However, light is reflected by the reflecting layer formed on the opposite side and is not transmitted through the adjacent cells. Light transmitted the barrier rib can reach the light detector 3 without passing through the scintillator layer 7. Light transmitted through the barrier rib efficiently reaches the light detector 3 since the light is not scattered by the phosphor as compared with light which is transmitted through the scintillator layer 7. Particularly, it is possible to make use of light emitted from the phosphor located separately from the light detector 3 with high efficiency. Therefore, a luminance is improved in the obtained radiation detection device. In this case, it is preferred that the barrier rib has a high light transmittance, and a transmittance of light having a wavelength of 550 nm at a thickness of 30 µm of the barrier rib is more preferably within a range of 10 to 100%.

When radiation is incident from a scintillator panel, the material of a scintillator panel side substrate 4 is preferably a material having high transmission properties of radiation, and various glasses, polymer materials, metals, and the like can be used. For example, it is possible to use glass sheets made of glasses such as quartz, borosilicate glass, and chemically reinforced glass; ceramic substrates made of ceramics such as sapphire, silicon nitride, and silicon carbide; semiconductor substrates made of semiconductors such as silicon, germanium, gallium arsenide, gallium phosphide, and gallium nitrogen; polymer films (plastic films) such as a cellulose acetate film, a polyester film, a polyethylene terephthalate film, a polyamide film, a polyimide film, a triacetate film, a polycarbonate film, and a carbon fiber reinforced resin sheet; metal sheets such as an aluminum sheet, an iron sheet, and a copper sheet; and metal sheets having a coating layer of a metal oxide, and amorphous carbon substrates. Of these, a plastic film and a glass sheet are preferable in view of flatness and heat resistance. Since weight reduction of the scintillator panel is promoted for pursuing convenience of transportation of the scintillator panel, the glass sheet is preferably a thin glass.

Meanwhile, radiation is incident from a light detector side, a material of a scintillator panel substrate 4 may be a material having transmission properties of radiation. However, a substrate made of a radiation shielding material, namely, a radiation shielding substrate is preferably used for the purpose of shielding radiation so as not to leak outside a radiation detection device. Examples of the radiation shielding substrate include metal sheets such as an iron sheet and a lead sheet; or glass sheets or films containing heavy metals such as iron, lead, gold, silver, copper, platinum, tungsten, bismuth, tantalum, and molybdenum. When a radiation shielding layer 5 is formed between a substrate and a barrier rib 6 on the side where no radiation is incident, it became less necessary that the scintillator panel substrate 4 is a radiation shielding substrate.

Examples of the material of radiation shielding layer 5 include glasses or ceramics containing heavy metals such as iron, lead, gold, silver, copper, platinum, tungsten, bismuth, tantalum, or molybdenum, which are capable of absorbing radiation.

The radiation shielding layer 5 can be formed, for example, by applying a paste for radiation shielding layer, prepared by dispersing an organic component and an inorganic powder including the above-mentioned materials in a solvent to a substrate, followed by drying to form a coating film, and firing the coating film at a temperature of preferably 500 to 700° C., and more preferably 500 to 650° C.

It is preferred that the radiation shielding layer and the barrier rib are simultaneously fired since the number of steps is reduced. In order to prevent dissolution and peeling from occurring when a paste for barrier rib is applied, it is also preferred to perform thermal curing after forming a coating film using, as an organic component of a paste for radiation shielding layer, a thermosetting organic component containing a polymerizable monomer, a polymerizable oligomer, or a polymerizable polymer, and a thermal polymerization initiator.

It is advantageous that the barrier rib is composed of a material containing, as a main component, a low melting point glass in view of durability, heat resistance, and high-definition processing. The barrier rib is preferably composed of a material which contains, as a main component, a low melting point glass containing 2 to 20% by mass of an alkali metal oxide. The material containing, as a main component, a low melting point glass containing 2 to 20% by mass of an alkali metal oxide has appropriate refractive index and softening temperature, and is suitable for forming a narrow barrier rib with high accuracy in a large area. The low melting point glass refers to a glass having a softening temperature of 700° C. or lower. The phrase "containing, as a main component, a low melting point glass containing 2 to 20% by mass of an alkali metal oxide" means that a low melting point glass containing 2 to 20% by mass of an alkali metal oxide accounts for 50 to 100% by mass of a material constituting the barrier rib.

A method for manufacturing a scintillator panel of the present invention preferably includes: a step of forming a photosensitive paste coating film by applying a photosensitive paste containing a low melting point glass and a photosensitive organic component onto a substrate; an exposure step of exposing the obtained photosensitive paste coating film to light; a development step of dissolving and removing apart of the exposed photosensitive paste coating film which is soluble in a developer; a firing step of heating the photosensitive paste coating film pattern after development to a firing temperature of 500 to 700° C. to thereby remove the organic component, and soften and sinter the low melting point glass, thus forming a barrier rib; forming a metallic reflecting layer on the barrier rib; and a step of filling cells divided by the barrier rib with a phosphor.

In the exposure step, a necessary part of the photosensitive paste coating film is photocured, or an unnecessary part of the photosensitive paste coating film is photodecomposed by exposure to add contrast of dissolution of the photosensitive paste coating film in a developer. In the development step, a part of the exposed photosensitive paste coating film which is soluble in a developer is removed with a developer to obtain a photosensitive paste coating film pattern in which only a necessary part of the coating film remains.

In the firing step, the obtained photosensitive paste coating film pattern is fired at a temperature of 500 to 700° C., preferably 500 to 650° C., whereby the organic component is decomposed and removed, and the low melting point glass is softened and sintered to form a barrier rib containing a low melting point glass. In order to completely remove the organic component, the firing temperature is preferably 500° C. or higher. If the firing temperature is higher than 700° C., deformation of the substrate increases when a general glass substrate is used as the substrate, and therefore the firing temperature is preferably 700° C. or lower.

The method of the present invention is capable of forming a barrier rib with high accuracy as compared to a method in which a glass paste is printed by laminating by a multi-layer screen printing and then fired.

The photosensitive paste is preferably composed of an organic component having photosensitivity, and an inorganic powder containing a low melting point glass which contains 2 to 20% by mass of an alkali metal oxide. The organic component is required in a given amount so as to form a photosensitive paste coating film pattern before firing. If the amount of the organic component is excessively large, the amount of substances to be removed in the firing step increases, so that the shrinkage rate after firing becomes large, and thus pattern defects are likely to occur in the firing step. Meanwhile, an excessively small amount of the organic component may not be preferable since miscibility and dispersibility of an inorganic powder in the paste deteriorate, so that not only defects are likely to occur during firing, but also coatability of the paste deteriorates due to an increase in viscosity of the paste, and also an adverse influence is exerted on stability of the paste. Therefore, the content of the inorganic powder in the photosensitive paste is preferably 30 to 80% by mass, and more preferably 40 to 70% by mass. The content of the low melting point glass is preferably 50 to 100% by mass based on the total of the inorganic powder. The content of the low melting point glass of less than 50% by mass based on the inorganic powder is not preferable since sintering does not satisfactorily proceed in the firing step, leading to a decrease in strength of the barrier rib thus obtained.

In order to ensure that the organic component is removed almost completely and the barrier rib obtained has a given strength in the firing step, it is preferable to use, as the low melting point glass, a low melting point glass containing a low melting point glass having a softening temperature of 480° C. or higher. If the softening temperature is lower than 480° C., the low melting point glass is softened before the organic component is sufficiently removed during firing, thus incorporating the residue of the organic component into the glass. In this case, the organic component may be gradually released later to cause deterioration of product quality. The residue of the organic component incorporated into the glass may cause coloration of the glass. When a glass powder made of a low melting point glass powder having a softening temperature of 480° C. or higher is used and firing is performed at 500° C. or higher, the organic component can be completely removed. As mentioned above, the firing temperature in the firing step is advantageously 500 to 700° C., and preferably 500 to 650° C., and thus the softening temperature of the low melting point glass is preferably 480 to 680° C., and more preferably 480 to 620° C.

The softening temperature is determined by extrapolating a heat absorption completion temperature at an endothermic peak by a tangent method from a DTA curve obtained by measuring a sample using a differential thermal analyzer (DTA, "Differential Type Differential Thermal Balance TG8120" manufactured by Rigaku Corporation). Specifically, an inorganic powder as a measurement sample is measured by elevating the temperature at 20° C./minute from room temperature with an alumina powder as a standard sample using a differential thermal analyzer to obtain a DTA curve. A softening point Ts determined by extrapolating a heat absorption completion temperature at an endothermic peak by a tangent method from the obtained DTA curve is defined as a softening temperature.

In order to obtain a low melting point glass, it is possible to use a metal oxide selected from the group consisting of lead oxide, bismuth oxide, zinc oxide, and alkali metal oxide, which are materials effective for lowering the melting point of glass. Of these, an alkali metal oxide is preferably used to thereby adjust the softening temperature of glass. Generally, the alkali metal refers to lithium, sodium, potassium, rubidium and cesium, while the alkali metal oxide for use in the present invention refers to a metal oxide selected from the group consisting of lithium oxide, sodium oxide, and potassium oxide.

In the present invention, the content X of an alkali metal oxide ($M_2O$) in the low melting point glass is preferably within a range of 2 to 20% by mass. If the content of the alkali metal oxide is less than 2% by mass, the softening temperature becomes high, thus requiring to perform the firing step at a high temperature. Therefore, when a glass substrate is used as the substrate, the scintillator panel thus obtained is distorted or defects occur in the barrier rib due to deformation of the substrate in the firing step. If the content of the alkali metal oxide is more than 20% by mass, the viscosity of glass decreases too much in the firing step. Therefore, the shape of the barrier rib obtained is likely to be distorted. Further, the porosity of the barrier rib thus obtained becomes excessively small, leading to a decrease in light emission luminance of the scintillator panel thus obtained.

Further, it is preferred to add 3 to 10% by mass of zinc oxide, in addition to the alkali metal oxide, so as to adjust the viscosity of glass at a high temperature. If the content of zinc oxide is less than 3% by mass, the viscosity of glass at a high temperature tends to become high. The content of zinc oxide is more than 10% by mass, the cost of glass tends to increase.

Further, inclusion of silicon oxide, boron oxide, aluminum oxide, or an oxide of an alkali earth metal in the low melting point glass, in addition to the alkali metal oxide and zinc oxide, enables control of stability, crystallinity, transparency, refractive index, or thermal expansion characteristic of the low melting point glass. The composition of the low melting point glass is preferably adjusted within a range of the composition range mentioned below since it is possible to prepare a low melting point glass having a viscosity characteristic suitable for the present invention.

Alkali metal oxide: 2 to 20% by mass
Zinc oxide: 3 to 10% by mass
Silicon oxide: 20 to 40% by mass
Boron oxide: 25 to 40% by mass
Aluminum oxide: 10 to 30% by mass
Alkali earth metal oxide: 5 to 15% by mass The alkali earth metal refers to one or more metals selected from the group consisting of magnesium, calcium, barium, and strontium.

The particle diameter of inorganic particles containing a low melting point glass can be evaluated using a particle size distribution analyzer ("MT 3300" manufactured by NIK-KISO CO., LTD.). As a measurement method, an inorganic powder is charged in a sample chamber filled with water, and subjected to an ultrasonic treatment for 300 seconds, followed by the measurement.

The 50% volume average particle diameter (D50) of the low melting point glass is preferably 1.0 to 4.0 μm. If D50 is less than 1.0 μm, particles strongly agglomerate and it becomes difficult to achieve uniform dispersibility, leading to deterioration of flow stability of a paste. In this case, when a paste is applied, uniformity of thickness of the coating film deteriorates. If D50 is more than 4.0 μm, surface unevenness of a sintered body thus obtained increases, thus causing breakage of a pattern in the subsequent step.

The photosensitive paste may contain, as the filler, a high melting point glass which is not softened even at 700° C., and ceramic particles such as particles of silicon oxide, aluminum oxide, titanium oxide, or zirconium oxide, in addition to the above-mentioned low melting point glasses. The filler, when used together with the low melting point glass, has the effect of controlling the shrinkage rate after firing of a paste composition and retaining the shape of the barrier rib to be formed. However, if the ratio of the filler to the total inorganic powder is more than 50% by mass, sintering of the low melting point glass is hindered to cause a problem such as a reduction in strength of the barrier rib, unfavorably. The filler preferably has an average particle diameter of 0.5 to 4.0 μm for the same reason as that of the low melting point glass.

In the photosensitive paste, the refractive index n1 of the low melting point glass and the refractive index n2 of the organic component preferably satisfy a relation: $-0.1<n1-n2<0.1$, more preferably $-0.01 \le n1-n2 \le 0.01$, and more preferably $-0.005 \le n1-n2 \le 0.005$. By satisfying these conditions, light scattering at the interface between the low melting point glass and the photosensitive organic component is suppressed in the exposure step, thus enabling formation of a pattern with high accuracy. Adjustment of the blending ratio of oxides constituting the low melting point glass makes it possible to obtain a low melting point glass having both preferable thermal characteristics and preferable refractive index.

The refractive index of the low melting point glass can be measured by a Becke line detection method. A refractive index at 25° C. and at a wavelength of 436 nm (g-line) was defined as the refractive index of the low melting point glass. The average refractive index of the organic component can be determined by measuring a coating film composed of an organic component by ellipsometry. A refractive index at 25° C. and a wavelength of 436 nm (g-line) was defined as the refractive index of the photosensitive organic component.

When the photosensitive paste contains a photosensitive organic component as an organic component, pattern processing can be performed by the above-mentioned photosensitive paste method. Use of a photosensitive monomer, a photosensitive oligomer, a photosensitive polymer, or a photo-polymerization initiator as the photosensitive organic component enables control of reactivity. Here, the photosensitivity in the photosensitive monomer, the photosensitive oligomer, and the photosensitive polymer means that when the paste is irradiated with active ray, the photosensitive monomer, the photosensitive oligomer, or the photosensitive polymer undergoes a reaction of photo-crosslinking, photo-polymerization, or the like to change the chemical structure.

The photosensitive monomer is a compound having an active carbon-carbon double bond, and examples thereof include nonfunctional compounds and polyfunctional compounds having a vinyl group, an acryloyl group, a methacryloyl group, or an acrylamide group as a functional group. Particularly, it is preferable that the organic component contains 10 to 80% by mass of a compound selected from the group consisting of polyfunctional acrylate compounds and polyfunctional methacrylate compounds from the viewpoint of increasing the crosslinking density during curing by a photoreaction to improve pattern formability. Since various compounds have been developed as the polyfunctional acrylate compounds and polyfunctional methacrylate compounds, it is possible to appropriately select from among those compounds, taking reactivity, refractive index, and the like into consideration.

It is possible to preferably use, as the photosensitive oligomer or the photosensitive polymer, an oligomer or polymer having an active carbon-carbon unsaturated double bond. The photosensitive oligomer or the photosensitive polymer is obtained, for example, by copolymerizing a carboxyl group-containing monomer such as acrylic acid, methacrylic acid, itaconic acid, crotonic acid, maleic acid, fumaric acid, vinylacetic acid, or an acid anhydride thereof, with a monomer such as a methacrylic acid ester, an acrylic acid ester, styrene, acrylonitrile, vinyl acetate, or 2-hydroxyacrylate. It is possible to use, as a method for introducing an active carbon-carbon unsaturated double bond into an oligomer or a polymer, a method in which an ethylenically unsaturated compound having a glycidyl group or an isocyanate group, acrylic acid chloride, methacrylic acid chloride, or acryl chloride, or a carboxylic acid such as maleic acid is reacted with a mercapto group, an amino group, a hydroxyl group, or a carboxyl group in an oligomer or a polymer, or the like.

It is possible to obtain a photosensitive paste, which is less likely to cause pattern defects in the firing step, by using, as the photosensitive monomer or the photosensitive oligomer, a monomer or oligomer having a urethane bond. In the present invention, rapid shrinkage is less likely to occur in the process of proceeding of sintering of a glass in the later stage of the firing step by using a low melting point glass as the glass. This enables suppression of breakage of the barrier rib in the firing step. In addition, when a compound having a urethane structure is used for the organic component, stress relaxation occurs in the process of decomposition and distillation of the organic component in the early stage of the firing step, thus enabling suppression of breakage of the barrier rib within a wide temperature range.

The photo-polymerization initiator is a compound which generates radicals when irradiated with active ray. Specific examples thereof include benzophenone, methyl o-benzoylbenzoate,
4,4-bis(dimethylamino)benzophenone,
4,4-bis(diethylamino)benzophenone, 4,4-dichlorobenzophenone,
4-benzoyl-4-methyl diphenyl ketone, dibenzyl ketone, fluorenone,
2,2-dimethoxy-2-phenylacetophenone,
2-hydroxy-2-methylpropiophenone, thioxanthone,
2-methylthioxanthone, 2-chlorothioxanthone,
2-isopropylthioxanthone, diethylthioxanthone, benzyl, benzyl methoxyethylacetal, benzoin, benzoin methyl ether, benzoin butyl ether, anthraquinone, 2-t-butylanthraquinone, anthrone, benzanthrone, dibenzosuberone, methylene anthrone,
4-azidobenzalacetophenone,
2,6-bis(p-azidobenzylidene)cyclohexanone,
2,6-bis(p-azidobenzylidene)-4-methylcyclohexanone,
1-phenyl-1,2-butadione-2-(O-methoxycarbonyl)oxime,
1-phenyl-1,2-propanedione-2-(O-ethoxycarbonyl)oxime,
1,3-diphenylpropanetrione-2-(O-ethoxycarbonyl) oxime,
1-phenyl-3-ethoxypropanetrione-2-(O-benzoyl)oxime,
Michler ketone,
2-methyl-1-[4-(methylthio)phenyl]-2-morphorino-1-propanone,
2-benzyl-2-dimethylamino-1-(4-morpholinophenyl) butanone-1, naphthalenesulfonyl chloride, quinolinesulfonyl chloride, N-phenylthioacridone, benzothiazole disulfide, triphenylphosphine, benzoin peroxide, eosine, and combinations of a photo-reductive pigment such as methylene blue and reducing agents such as ascorbic acid and triethanolamine. Two or more of these compounds may be used in combination.

The photosensitive paste may contain, as a binder, a copolymer having a carboxyl group. The copolymer having a carboxyl group is obtained, for example, by selecting a carboxyl group-containing monomer such as acrylic acid, methacrylic acid, itaconic acid, crotonic acid, maleic acid, fumaric acid, vinylacetic acid, or an acid anhydride thereof, and the other monomer such as a methacrylic acid ester, an acrylic acid ester, styrene, acrylonitrile, vinyl acetate, or 2-hydroxy acrylate, and copolymerizing the monomer using an initiator such as azobisisobutyronitrile. A copolymer having an acrylic acid ester or a methacrylic acid ester and acrylic acid or methacrylic acid as copolymerization components is preferably used as the copolymer having a carboxyl group because of low thermal decomposition temperature during firing.

The photosensitive paste becomes a paste having excellent solubility in an aqueous alkali solution when containing a copolymer having a carboxyl group. The acid value of the copolymer having a carboxyl group is preferably 50 to 150 mg KOH/g. When the acid value is 150 mg KOH/g or less, the allowable range of development can be widened. When the acid value is 50 mg KOH/g or more, solubility of the unexposed area in a developer does not decrease. Therefore, there is no need to increase the concentration of the developer and peeling of the exposed area is prevented, thus making it possible to obtain a high-definition pattern can be obtained. Further, it is also preferable that the copolymer having a carboxyl group has an ethylenically unsaturated group on a side chain. Examples of the ethylenically unsaturated group include an acrylic group, a methacrylic group, a vinyl group, an allyl group, and the like.

The photosensitive paste is prepared by optionally adding an organic solvent and a binder to a low melting point glass and a photosensitive organic component containing a photosensitive monomer, a photosensitive oligomer, a photosensitive polymer, or a photo-polymerization initiator, and compounding various components so as to achieve a predetermined composition, and uniformly mixing and dispersing the mixture using a three-roll roller or a kneader.

The viscosity of the photosensitive paste can be appropriately adjusted by the addition ratio of an inorganic powder, a thickener, an organic solvent, a polymerization inhibitor, a plasticizer, and a precipitation preventive agent, and is preferably within a range of 2 to 200 Pa·s. For example, when the photosensitive paste is applied to the substrate by a spin coating method, the viscosity is preferably 2 to 5 Pa·s. When the photosensitive paste is applied to the substrate by a screen printing method to achieve a film thickness of 10 to 20 μm in a single application, the viscosity is preferably 50 to 200 Pa·s. When a blade coater method or a die coater method, the viscosity is preferably 10 to 50 Pa·s.

A barrier rib can be formed by applying the thus prepared photosensitive paste onto a substrate, and forming a desired pattern using a photolithography method, followed by firing. An example of manufacturing a barrier rib by the diameter Dp method using the above-mentioned photosensitive paste will be described below, but the present invention is not limited thereto.

The photosensitive paste is applied onto the whole or part of a surface of a substrate to forma photosensitive paste coating film so that the height after firing becomes the desired height of the barrier rib. It is possible to use as a coating method, a screen printing method, or a method using a bar coater, a roll coater, a die coater, or a blade coater. The coating thickness can be adjusted by selecting the number of applications, mesh of the screen, and a viscosity of the paste.

Subsequently, an exposure step is performed. An exposure method is commonly a method in which exposure is performed through a photomask as in usual photolithography. In this case, a photosensitive paste coating film is exposed through a photomask having a predetermined opening corresponding to the objective pattern of a barrier rib. Alternatively, a method of directly drawing by laser light without using a photomask may be used. It is possible to use, as an exposure device, a proximity exposure machine, or the like. When exposure of a large area is performed, a large area can be exposed using an exposure machine having a small exposure area by performing exposure while transferring after applying the photosensitive paste onto the substrate. Examples of the active ray for use in exposure include near infrared ray, visible ray, and ultraviolet ray. Of these, ultraviolet ray is preferable. It is possible to use, as a light source thereof, for example, a low-pressure mercury lamp, a high-pressure mercury lamp, an ultra-high pressure mercury lamp, a halogen lamp, or a germicidal lamp, and an ultra-high pressure mercury lamp is preferable. Exposure conditions vary depending on the thickness of the photosensitive paste coating film, and is usually performed for 0.01 to 30 minutes using an ultra-high pressure mercury lamp with a power of 1 to 100 mW/cm$^2$.

After exposure, development is performed by making use of a difference in solubility in a developer between the exposed area and the unexposed area of the photosensitive paste coating film to obtain a desired grid-like or stripe-like photosensitive paste coating film pattern. Development is performed using a dipping method, a spray method, or a brush method. It is possible to use a solvent into which an organic component in a paste is soluble, for the developer. Preferably, the developer contains water as a main component. When a compound having an acidic group such as a carboxyl group exists in the paste, development can be performed with an aqueous alkali solution. It is possible to use, as the aqueous alkali solution, an aqueous inorganic alkali solution such as that of sodium hydroxide, sodium carbonate or calcium hydroxide can be used, but use of an aqueous organic alkali solution is more preferable because an alkali component is easily removed during firing. Examples of the organic alkali include tetramethylammonium hydroxide, trimethylbenzylammonium hydroxide, monoethanolamine, diethanolamine, and the like. The concentration of the aqueous alkali solution is preferably 0.05 to 5% by mass, and more preferably 0.1 to 1% by mass. If the alkali concentration is excessively low, a soluble part may not be removed, and if the alkali concentration is excessively high, a pattern part may be peeled and a non-soluble part may be corroded. The development temperature during development is preferably 20 to 50° C. in view of process control.

Next, a firing step is performed in a firing furnace. The atmosphere and temperature for the firing step vary depending on types of the photosensitive paste and the substrate, but firing is performed in air or in an atmosphere of nitrogen, hydrogen, or the like. It is possible to use, as the firing furnace, a batch-type firing furnace or a belt-type continuous firing furnace. Preferably, firing is performed by normally retaining at a temperature of 500 to 700° C. for 10 to 60 minutes. The firing temperature is more preferably 500 to 650° C. By the step mentioned above, the organic component is removed from the grid-like or stripe-like photosensitive paste coating film pattern, and the low melting point glass contained in the coating film pattern is softened and sintered to obtain a barrier rib member in which a grid-like barrier rib substantially composed of an inorganic substance is formed onto a substrate.

Next, a reflecting layer is formed. The method for forming a reflecting layer is not particularly limited, and it is possible to make use of various film formation methods such as a method in which a paste containing a reflecting layer is applied and then a solvent is removed by firing, a method in which the paste is sprayed by a spray, and a plating method. Of these, a vacuum film formation method is preferable since a uniform reflecting layer can be formed at comparatively low temperature. Examples of the vacuum film formation method include vacuum deposition, sputtering, ion plating, CVD, and laser ablation, and sputtering is more preferable since a uniform film can be formed on the side surface of the barrier rib. If a temperature higher than the firing temperature of the barrier rib is applied during formation of the reflecting layer, the barrier rib is deformed, and therefore the temperature during formation of the reflecting layer is preferably lower than the temperature during formation of the barrier rib.

The material of the reflecting layer is not particularly limited and it is preferred to use a material capable of reflecting visible light which is an electromagnetic wave having a wavelength 300 to 800 nm emitted by a phosphor. Of these, metal such as silver, god, aluminum, nickel, or titanium, or metal oxide, which is less likely to deteriorate, is preferable.

For the purpose of efficiently making use of emitted light of the phosphor, a reflectance of emitted light having a wavelength of 550 nm is preferably 60% or more, and more preferably 80% or more.

When a reflecting layer is formed on only one side of the barrier rib, examples of the method thereof include a method in which a film is formed in a state where a substrate is inclined at an angle of 45 degree of more relative to a sputtering target of metal when using a sputtering method, or a method in which after masking a side on which a reflecting layer is not formed, a reflecting layer is formed and then a masking material is removed.

When the reflecting layer is formed only in specific cells, a reflecting layer can be formed on only one side of the barrier rib. Examples of the method of forming a reflecting layer only in specific cells include a method in which a paste for reflecting layer, containing a reflecting layer powder, an organic binder, and an organic solvent as main components is applied in the objective cells, dried and then optionally fired. Here, examples of the method in which a paste for reflecting layer is applied in cells include a screen printing method in which pattern printing is performed using a screen printing plate, a dispenser method in which a paste for reflecting layer is pattern-applied from tip of a discharge nozzle, or an ink-jet method. It is also possible to use a photosensitive paste method in which a paste for photosensitive reflecting layer, containing a photosensitive organic component is applied on the entire surface, and then a paste for photosensitive reflecting layer of an unnecessary part is removed by exposure and development. Of these, a dispenser method is preferable in view of productivity.

In order to improve a reflectance of light and to prevent transmission, a light shielding layer is preferably formed between the barrier rib and the reflecting layer. It is more preferred that a light shielding layer is formed on a surface of the reflecting layer and also the reflecting layer is formed on the light shielding layer. The material of the light shielding layer is not particularly limited, and a metal layer of chromium, nichrome, tantalum, or the like, a resin containing a black pigment such as carbon, or the like can be used. The method for forming a light shielding film is not particularly limited, and a method including applying a pasty material containing a light shielding material, or various vacuum film formation methods can be used.

The height H1 of the barrier rib is preferably 100 to 3,000 μm, and more preferably 150 to 500 μm. If H1 is more than 3,000 μm, processability in the case of forming the barrier rib deteriorates. Meanwhile, if H1 is less than 100 μm, the amount of fillable phosphor decreases, leading to a decrease in light emission luminance of the scintillator panel thus obtained.

The distance P1 of the adjacent barrier rib is preferably 30 to 1,000 μm. If P1 is less than 30 μm, processability in the case of forming the barrier rib deteriorates. If P1 is too large, accuracy of images of the scintillator panel thus obtained deteriorates. The height H1 of the barrier rib is preferably larger than the distance P1 of the barrier rib. This is because an increase in height of the barrier rib leads to an increase in amount of the phosphor to be filled, thus improving light emission luminance.

Regarding the barrier rib width, the width (bottom width) L2 at the interface where the barrier rib and the substrate are in contact with each other is preferably larger than the width L1 of the top (light detector side) of the barrier rib. It is possible to improve reflection efficiency and extraction efficiency of emitted light of the scintillator layer by taking a pseudo-trapezoidal structure in which the barrier rib width of the light detector side is small. When radiation is incident from the light detector side, utilization efficiency of radiation can be enhanced by increasing the filling amount of the phosphor in the vicinity of the light detector side. Further, when the reflecting layer is formed on the barrier rib surface after forming the barrier rib, if L1 is larger than L2, the barrier rib side in the vicinity of the top of the barrier rib may be shielded by the top of the barrier rib, thus failing to form a reflecting layer.

The bottom width L2 is preferably 10 to 150 μm, and the top width L1 is preferably 5 to 80 μm. If L2 is less than 10 μm, defects of the barrier rib are likely to occur during firing. Meanwhile, if L2 is more than 150 μm, the amount of the phosphor capable of being filed in the space divided by the barrier rib decreases. If L1 is less than 5 μm, the strength of the barrier rib decreases. Meanwhile, if L1 is more than 80 μm, the range capable of extracting emitted light of the scintillator layer is narrowed. In order to enhance sharpness of the radiation detection device, a barrier rib is preferably located between the light detection pigment of the photoelectric conversion layer, and L1 is more preferably made shorter than the distance between adjacent light detection pixels.

An aspect ratio of H1 to L2 (H1/L2) is 1.0 to 25.0. A barrier rib having a larger aspect ratio (H1/L2) can be filled with a larger amount of the phosphor because of its wide space per pixel divided by the barrier rib.

An aspect ratio of H1 to P1 (H1/P1) is 1.0 to 3.5. A barrier rib having a larger aspect ratio (H1/P1) becomes one pixel divided with high definition, and also the space per pixel can be filled with a larger amount of the phosphor.

The height H1 of the barrier rib and the distance P1 of the barrier rib can be measured by exposing a barrier rib cross-section perpendicular to the substrate, and observing the cross-section by a scanning electron microscope (for example, "S4600", manufactured by Hitachi, Ltd.). The width of the barrier rib at a contact part between the barrier rib and the substrate is defined as L2. When a radiation shielding layer exists between the barrier rib and the substrate, the width of the barrier rib at a contact part between the barrier rib and the shielding layer is defined as L2. The width of the topmost of the barrier rib is defined as L1. When it is difficult to accurately grasp the top of the barrier rib or the bottom of the barrier rib since the top of the barrier rib is rounded or the topmost of the barrier rib undergoes hemming, 90% height width (L90) may be measured in place of L1 and 10% height width (L10) may be measured in place of L2. L90 refers to a line width of the part of the height of 90 from the bottom surface of the barrier rib when H1 is 100. Similarly, L10 refers to a line width of the part of the height of 10 from the bottom surface of the barrier rib when H1 is 100.

A scintillator panel can be completed by filling cells divided by the barrier rib with a phosphor and a binder resin. Here, the cell refers to a space divided by a grid-like or stripe-like barrier rib. The phosphor and the binder resin filled in the cell may be referred to as a scintillator layer.

Regarding the amount of the scintillator layer to be filled in cells divided by the barrier rib, a volume fraction of the scintillator layer occupying cells, namely, the filling rate of the scintillator layer is preferably 50 to 100% by volume. If the filling rate of the scintillator layer is less than 50% by volume, efficiency of converting incident radiation into visible light decreases. It is also possible to increase conversion efficiency of incident radiation by increasing an aspect ratio of a barrier rib height to a barrier rib pitch. However, it is preferred that conversion efficiency can be more increased by filling the space of cells with a phosphor in high density.

In order to determine a filling rate of the scintillator layer, first, a cross-sectional area of the space in cells per cell is calculated from the height H1 of the barrier rib, the distance P1 of the barrier rib, the width L1 of the barrier rib top, and the width L2 of the barrier rib bottom thus determined above. Next, using an optical microscope, the height of the scintillator layer in cells is measured. The cross-sectional area of the scintillator layer in cells is calculated from the H1, P1, L1, L2, and the height of the scintillator layer. A ratio of the cross-sectional area of the scintillator layer to the cross-sectional area of the space in cells is defined as a filling rate. When it is difficult to measure in the above manner, the cross-section of the substrate is observed using a scanning electron microscopy and an area of cells and an area of the scintillator layer are determined from images of the cross-section, and then a ratio of the area of the scintillator layer to the area of the space of cells is calculated to obtain a filling rate.

The inventors have found that scattering of light emitted from the phosphor at the interface between the phosphor and air leads to a decrease in luminance of the scintillator panel. In an embodiment of the present invention, as shown in FIG. 1, the periphery of the phosphor is filled with a binder resin contained in the scintillator layer, thus enabling suppression of scattering of light due to a surface of the phosphor, leading to an improvement in luminance. The binder resin can suppress scattering of light due to a surface of the barrier rib. The content of the binder resin is preferably 50% by mass or less in the scintillator layer made of a phosphor and a binder resin. Too large content of the binder resin in the scintillator layer leads to a decrease in amount of a phosphor powder and a decrease in amount of light emission, thus causing a decrease in luminance. The amount of the binder resin is more preferably 30% by mass or less, and still more preferably 20% by mass or less. Since too small amount of the binder resin leads to deterioration of the effect of suppressing scattering of light, the lower limit of the binder resin in the scintillator layer is preferably 1% by mass or more, more preferably 5% by mass or more, and still more preferably 10% by mass or more.

If a difference in refractive index between a refractive index Np of the phosphor and a refractive index Nb of the binder resin is too large, since light reflection at the interface increases, leading to deterioration of extraction efficiency of emitted light of the phosphor, it is preferred to satisfy a relation:

$$-0.8 < Np - Nb < 0.8.$$

The refractive index Np of the phosphor can be measured by the Becke line detection method. The refractive index of the phosphor at 25° C. and a wavelength of 550 nm was defined as a refractive index of the phosphor. The refractive index Nb of the binder resin can be determined by forming a 30 μm thick coating film made only of a binder resin, followed by the measurement of the coating film using ellipsometry. The refractive index of the phosphor at 25° C. and a wavelength of 550 nm was defined as a refractive index of the binder resin.

Use of a barrier rib made of a material containing a low melting point glass, as a main component, as a light conduction path is effective as a method for efficiently extracting emitted light of the phosphor. In this case, if a difference in refractive index between a refractive index Nr of the barrier rib and a refractive index Nb of the binder resin is too large, since light reflection at the interface increases, it is preferred to satisfy a relation:

$$-0.2 \leq Nr - Nb \leq 0.2.$$

The refractive index of Nr can be determined by forming a 30 μm thick coating film made only of a barrier rib material, followed by the measurement in the same manner as in the case of the refractive index of Nb of the binder resin.

It is possible to use, as the phosphor, various known radiation phosphor materials. Particularly, a material having a high conversion rate of radiation to visible light, such as CsI, $Gd_2O_2S$, $Lu_2O_2S$, $Y_2O_2S$, $LaCl_3$, $LaBr_3$, $LaI_3$, $CeBr_3$, $CeI_3$, $LuSiO_5$, or Ba (Br, F, Zn) is used, but the phosphor is not limited thereto. In order to enhance luminous efficiency, various activators may be added. For example, in the case of CsI, a mixture of CsI and sodium iodide (NaI) in an arbitrary molar ratio, or CsI containing activation substances such as indium (In), thallium (Tl), lithium (Li), potassium (K), rubidium (Rb) or sodium (Na) is preferable. Further, a thallium compound such as thallium bromide (TlBr), thallium chloride (TlCl), or thallium fluoride (TlF, $TlF_3$) can also be used as an activator. Because of its high luminous efficiency, a gadolinium oxysulfide powder $Gd_2O_2S$ ($Gd_2O_2S$:Tb) is preferable.

The phosphor is preferably a powder of spherical, flat, or rod-shaped particles. In this case, the phosphor preferably has an average particle diameter Dp of 0.1 to 25 μm since sufficient luminous efficiency is obtained and also it is easy to fill in cells. The particle diameter can be measured using a particle size distribution analyzer ("MT 3300" manufactured by NIKKISO CO., LTD.). As a measurement method, an inorganic powder is charged in a sample chamber filled with water, and subjected to an ultrasonic treatment for 300 seconds, followed by the measurement.

The binder resin contained in the scintillator layer is preferably a material having a high light transmittance since the binder resin satisfactorily transmits light emitted from the phosphor, leading to an increase in luminance. The light transmittance of the binder resin in the present invention refers to a transmittance when a 30 μm film made of the binder resin is irradiated with light having a wavelength of 550 nm. The light transmittance of the binder resin is preferably 50% or more, and more preferably 70 to 100%.

Regarding the light transmittance of the binder resin, a 30 μm thick film made of the binder resin is formed on the entire surface of a glass substrate, and the value obtained by measuring a transmittance of light having a wavelength of 550 nm is defined as a transmittance of the binder resin.

Such binder resin is preferably a resin selected from the group consisting of an acrylic resin, an epoxy resin, a polyester resin, a butyral resin, a polyamide resin, a silicone resin, and ethyl cellulose.

Examples of the method for forming a scintillator layer include a method in which cells are filled with a phosphor paste prepared by mixing a powder of a phosphor, a binder resin, and an organic solvent such as terpineol or γ-butyrolactone by a screen printing method, a dispenser method, a vacuum printing method, or the like, followed by curing through a UV treatment or heating.

An adhesive layer may be formed between a barrier rib and a scintillator layer of a scintillator panel, and a light detector. The adhesive layer can be formed, for example, of a transparent adhesive composed of a thermally curable or ultraviolet curable resin. Such transparent adhesive is more preferably a transparent adhesive composed of an acrylic resin, an epoxy resin, a polyester resin, a butyral resin, a polyamide resin, or an ethyl cellulose resin. In order to minimally-suppress light scattering at the interface and to improve luminance by efficiently guiding emitted light of the phosphor to a photoelectric conversion layer, a difference in an average refractive index between a phosphor binder resin and an adhesive layer is preferably less than 0.5. Of course, it is also preferred that the binder resin of the scintillator layer is made equivalent to that of the adhesive layer. Here, when the phosphor is made of a single material, an average refractive index refers to a refractive index of the material. When the phosphor is made of a plurality of materials, an average refractive index refers to a weighted average of the respective refractive indices.

Since it is possible to efficiently guide emitted light to the photoelectric conversion layer, it is preferred to satisfy a relation: Nb≤Na≤Ns, where Nb denotes an average refractive index of a binder resin of a scintillator layer, Ns denotes an average refractive index of a photoelectric conversion layer, and Na denotes an average refractive index of an adhesive layer.

The refractive index Ns of the photoelectric conversion layer and the refractive index Na of the adhesive layer can be obtained in the same manner as in the case of a refractive index of Nb of the binder resin.

EXAMPLES

The present invention will be described in detail below by way of Examples. However, the present invention is not limited thereto.

(Raw Materials of Photosensitive Paste for Barrier Rib)

Raw materials used for the photosensitive paste of Examples are as follows.

Photosensitive monomer M-1: trimethylolpropane triacrylate

Photosensitive monomer M-2: tetrapropylene glycol dimethacrylate

Photosensitive polymer: product of addition reaction of 0.4 equivalent of glycidyl methacrylate with carboxyl groups of a copolymer of methacrylic acid/methyl methacrylate/styrene in a mass ratio of 40/40/30 (weight average molecular weight: 43,000, acid value: 100)

Photo-polymerization initiator:
2-benzyl-2-dimethylamino-1-(4-morpholinophenyl)butanone-1 ("10369", manufactured by BASF Corporation)

Polymerization inhibitor:
1,6-hexanediol-bis[(3,5-di-t-butyl-4-hydroxyphenyl)propionate])

Ultraviolet ray absorber solution: 0.3 mass γ-butyrolactone solution of Sudan IV (manufactured by TOKYO OHKA KOGYO Co., Ltd.)

Organic resin binder: ethyl cellulose (manufactured by Hercules Inc.)

Viscosity modifier: Flownon EC121 (manufactured by KYOEISHA CHEMICAL CO., LTD.)

Solvent: γ-butyrolactone

Low melting point glass powder:
27% by mass of $SiO_2$, 31% by mass of $B_2O_3$, 6% by mass of ZnO, 7% by mass of $Li_2O$, 2% by mass of MgO, 2% by mass of CaO, 2% by mass of BaO, and 23% by mass of $Al_2O_3$, refractive index (ng): 1.56, glass softening temperature: 588° C., thermal expansion coefficient: $70 \times 10^{-7}$/K, 50% volume average particle diameter: 2.3 μm (Preparation of Photosensitive Paste for Barrier Rib)

Four (4) parts by mass of a photosensitive monomer M-1, 6 parts by mass of a photosensitive monomer M-2, 24 parts by mass of a photosensitive polymer, 6 parts by mass of a photo-polymerization initiator, 0.2 part by mass of a polymerization inhibitor, and 12.8 parts by mass of an ultraviolet ray absorber solution were dissolved in 38 parts by mass of a solvent under heating at a temperature of 80° C. After cooling the obtained solution, 9 parts by mass of a viscosity modifier was added to prepare an organic solution. The refractive index (ng) of an organic coating film obtained by applying the organic solution to a glass substrate and drying the applied solution was 1.555.

Next, 30 parts by mass of a low melting point glass powder and 10 parts by mass of a high melting point glass powder were added to 60 parts by mass of the organic solution, and then the mixture was kneaded by a three-roll kneader to prepare a photosensitive paste for barrier rib.

(Preparation of Paste for Underlayer)

Forty (40) parts by mass of a terpineol solution (containing 10% by mass of ethyl cellulose), 15 parts by mass of dipentaerythrtol hexacrylate, 1 part by mass of azobisisobutyronitrile, 40 parts by mass of a low melting point glass powder (the material which is the same as the photosensitive paste for barrier rib), and 4 parts by mass of a titanium oxide powder were mixed and then kneaded to prepare a thermally curable paste for underlayer.

(Light Detector)

On a glass substrate having a size measuring 500 mm×500 Mm×0.5 mm in thickness (AN-100, manufactured by ASAHI GLASS CO., LTD.), a PIN type photodiode made of amorphous silicon having a refractive index of 3.5 and a plurality of light detection pixels made of TFT having a pixel size of 125 μm×125 μm were formed in a matrix form. Next, a wiring part including a bias wiring for applying a bias to the PIN type photodiode, a driving wiring for applying a driving signal to TFT, a signal wiring for outputting a signal charge transferred by TFT, and the like was formed of aluminum to produce a light detector.

Example 1

On a glass substrate having a size measuring 500 mm×500 Mm×0.5 mm in thickness (AN-100, manufactured by ASAHI GLASS CO., LTD.), the paste for underlayer was applied in a thickness of 15 μm by a bar coater, dried at 150° C. for 30 minutes, and then thermally cured to form a 12 μm thick underlayer paste film. Next, the photosensitive paste for barrier rib was applied by a die coater so as to obtain a dry thickness of 500 μm, and then dried at 120° C. for 30 minutes to form a photosensitive paste coating film for barrier rib.

Next, the photosensitive paste coating film for barrier rib was exposed at an exposure dose of 700 mJ/cm² by an ultra-high pressure mercury lamp through a photomask having an opening corresponding to a desired barrier rib pattern (chrome mask having a grid-like opening having a pitch of 125 μm and a line width of 10 μm). The exposed photosensitive paste coating film for barrier rib was developed in an aqueous 0.5 mass % ethanolamine solution to remove the unexposed area, thus forming a grid-like photosensitive paste coating film pattern. Further, the photosensitive paste coating film pattern was fired in air at 585° C. for 15 minutes to produce a substrate with a grid-like barrier rib having a barrier rib distance P1 of 125 μm, a top width L1 of 10 μm, a bottom width L2 of 20 μm, a barrier rib height H1 of 360 μm, and a size measuring 480 mm×480 mm formed on a surface thereof.

Next, a gadolinium oxysulfide powder $Gd_2O_2S$ ($Gd_2O_2S$:Tb) having an average particle diameter Dp of 6 μm and a refractive index of 2.2 as a phosphor was mixed with an UV-curable acrylic resin having an average refractive index of 1.49 as a binder resin in a mass ratio of 9:1 and the space divided by the barrier rib was filled with the mixture, and then the acrylic resin was cured by UV irradiation to produce a scintillator panel. The filling rate of the scintillator layer in the obtained scintillator panel was measured in the following manner. Using an optical microscope, a cross-section of the scintillator layer was observed at a magnification of 500 times and the height of the scintillator layer in cells was measured. The height of the scintillator layer was measured at 20 places in the substrate and an average thereof was defined as a height of the scintillator layer. The filling rate of the scintillator layer was calculated from the height of the scintillator layer, the barrier rib distance P1, the top width L1, the bottom width L2, and the height H1 of the barrier rib by the above-mentioned method and found to be 88% by volume.

In order to measure a light transmittance of the acrylic resin, only the UV-curable acrylic resin was applied on the entire surface of a glass substrate having a size measuring 500 mm×500 mm×0.5 mm in length (AN-100, manufactured by ASAHI GLASS CO., LTD.) so as to obtain a dry thickness of 30 μm. After curing the acrylic resin by UV irradiation, a transmittance of light having a wavelength of 550 nm was measured using a spectrophotometer ("U-4100", manufactured by Hitachi, Ltd.). As a result, the light transmittance was 95%.

Next, on a scintillator panel, an adhesive coating film made of a 10 μm thick hot melt resin was formed and a light detector was laid on an adhesive coating film while paying attention to prevent the scintillator panel from bending. In that case, the barrier rib provided on the scintillator panel and the light detection pixel, provided on the light detector were allowed to face each other, and the barrier rib was allowed to be located between adjacent light detection pixels. In this way, in a state where the scintillator panel and the light detector are laid one upon another via the adhesive coating film, air bubbles in the adhesive coating film were removed by evacuation with heating at 120° C. in a vacuum press, followed by cooling to room temperature. Thereafter, the adhesive coating film was cured to form an adhesive layer, thus producing a radiation detection device. The adhesive layer thus formed had an average refractive index of 1.6.

Next, X-ray at a voltage of 80 kVp was applied from the light detector side of the radiation detection device, and then the amount of light emitted from the scintillator layer was detected and measured by a light detection pixel and the measured value was regarded as luminance. At this time, a 20 mm thick aluminum filter for removal of soft X-ray was disposed between an X-ray source and a radiation detection device. A rectangular modulation transfer function (MTF) chart made of lead was disposed on the back side (face where no light detection pixel is formed) of the light detector. In the same manner, X-ray at a voltage of 80 kVp was applied through an aluminum filter, and then sharpness was calculated by analyzing X-ray image data obtained by detecting with the light detection pixel using a computer. These values were expressed by a relative value on the assumption that the value of a phosphor solid film including no barrier rib (corresponding to the scintillator panel produced in Comparative Example 2) is regarded as 100. As a result, luminance was 130 and sharpness was 147, and the both exhibited satisfactory value.

Example 2

In the same manner as in Example 1, a substrate including a grid-like barrier rib formed thereon was produced. Next, an aluminum reflecting layer was formed on the entire barrier rib using a batch type sputtering system ("SV-9045", manufactured by ULVAC, Inc.). The thickness of the aluminum reflecting layer in the vicinity of the barrier rib top was adjusted to 300 nm. At this time, the aluminum reflecting layer exhibits a reflectance of 90%.

Next, a gadolinium polysulfide powder $Gd_2O_2S$ ($Gd_2O_2S$:Tb) having an average particle diameter Dp of 6 μm and a refractive index of 2.2 as a phosphor was mixed with a thermally curable silicone resin having an average refractive index of 1.55 as a binder resin in a mass ratio of 9:1, and a space divided by the barrier rib was filled with the mixture, and then the silicone resin was cured by heating at 140° C. for 30 minutes to produce a scintillator panel, thus producing a radiation detection device in the same manner as in Example 1. This radiation detection device was evaluated in the same manner as in Example 1. As a result, luminance was 129 and sharpness was 193, and the both exhibited satisfactory value.

Comparative Example 1

In the same manner as in Example 1, a substrate including a grid-like barrier rib formed thereon was produced. Next, a gadolinium polysulfide powder $Gd_2O_2S$ ($Gd_2O_2S$:Tb) having an average particle diameter Dp of 6 μm and a refractive index of 2.2 was mixed with terpineol in a mass ratio of 9:1, and a space divided by the barrier rib was filled with the mixture, and then terpineol was dried and removed by heating at 250° C. for 10 minutes to produce a scintillator panel, thus producing a radiation detection device in the same manner as in Example 1. This radiation detection device was evaluated in the same manner as in Example 1. As a result, luminance was 45 and sharpness was 150, and the both exhibited satisfactory value.

Comparative Example 2

In the same manner as in Example 1, except that the barrier rib was not formed on the scintillator panel and a phosphor solid film was formed, a radiation detection device was produced.

The above evaluation results reveal that the radiation detection device utilizing the scintillator panel of the present invention exhibits high light emission luminance, thus enabling realization of high-definition images.

REFERENCE SIGNS LIST

1 Radiation detection device
2 Scintillator panel
3 Light detector
4 Scintillator panel side substrate
5 Radiation shielding layer
6 Barrier rib
7 Scintillator layer
7A Particulate phosphor
7B Binder resin
8 Reflecting layer
9 Photoelectric conversion layer
10 Light detector side substrate
11 Adhesive layer The present invention can be usefully used as a scintillator panel which is used in a radiation detection device used for a medical diagnostic apparatus, a nondestructive inspection instrument, and the like.

The invention claimed is:

1. A scintillator panel comprising a sheet-like substrate, a barrier rib provided on the substrate, and a scintillator layer filled in cells divided by the barrier rib, wherein
the barrier rib is made of a material containing a low melting point glass as a main component, and
the scintillator layer is made of a phosphor and a binder resin,
wherein a filling rate of the scintillator layer is 50% by volume or more, and the content of the binder resin in the scintillator layer is 50% by mass or less, and
wherein a refractive index Nr of the barrier rib, and a refractive index Nb of the binder resin satisfy a relation:

$-0.2 \leq Nr-Nb \leq 0.2$.

2. The scintillator panel according to claim 1, wherein a refractive index of Np of the phosphor and the refractive index of Nb of the binder resin satisfy a relation:

$-0.3 < Np-Nb < 0.8$.

3. The scintillator panel according to claim 1, wherein the phosphor has an average particle diameter Dp of 0.1 to 25 µm.

4. The scintillator panel according to claim 1, wherein the phosphor is a gadolinium oxysulfide powder.

5. The scintillator panel according to claim 1, wherein the binder resin has a light transmittance of 50% or more.

6. The scintillator panel according to claim 1, wherein the binder resin is a resin selected from the group consisting of an acrylic resin, an epoxy resin, a polyester resin, a butyral resin, a polyamide resin, a silicone resin, and ethyl cellulose.

7. The scintillator panel according to claim 1, wherein the barrier rib is made of a material which contains a low melting point glass containing 2 to 20% by mass of an alkali metal oxide as a main component.

8. The scintillator panel according to claim 1, wherein a width L2 of the interface where the barrier rib and the substrate are in contact each other is larger than a width L1 of the top of the barrier rib.

9. The scintillator panel according to claim 1, wherein a reflecting layer is formed in a surface of the barrier rib.

10. A method for manufacturing a scintillator panel, the method comprising:
forming a photosensitive paste coating film by applying a photosensitive paste containing a low melting point glass and a photosensitive organic component onto a substrate;
exposing the obtained photosensitive paste coating film to light;
dissolving and removing a part of the exposed photosensitive paste coating film which is soluble in a developer;
heating the photosensitive paste coating film pattern after development to a firing temperature of 500° C. to 700° C. to thereby remove the organic component, and soften and sinter the low melting point glass, thus forming a barrier rib; and
filling cells divided by the barrier rib with a phosphor and a binder resin,
wherein a filling rate of the cells is 50% by volume or more, and the content of the binder resin in the cells is 50% by mass or less, and
wherein a refractive index Nr of the barrier rib, and a refractive index Nb of the binder resin satisfy a relation:

$-0.2 \leq Nr-Nb \leq 0.2$.

* * * * *